United States Patent [19]

Miura et al.

[11] Patent Number: 5,017,998
[45] Date of Patent: May 21, 1991

[54] SEMICONDUCTOR DEVICE USING SOI SUBSTRATE

[75] Inventors: Takao Miura, Tokyo; Kazunori Imaoka, Komae; Fumitoshi Sugimoto, Kawasaki, all of Japan

[73] Assignee: Fujitsu Limited, Kawasaki, Japan

[21] Appl. No.: 572,597

[22] Filed: Aug. 27, 1990

[30] Foreign Application Priority Data

Sep. 14, 1989 [JP] Japan .................... 1-239038

[51] Int. Cl.$^5$ .................. H01L 27/12; H01L 27/02; H01L 29/34; H01L 29/06
[52] U.S. Cl. ........................... 357/49; 357/47; 357/54; 357/4; 357/55
[58] Field of Search .............. 357/49, 47, 54, 55, 357/4, 59, 51

Primary Examiner—Mark Prenty

Attorney, Agent, or Firm—Armstrong, Nikaido, Marmelstein, Kubovcik & Murray

[57] ABSTRACT

In a direct bonded SOI substrate where the $SiO_2$ films OA, OB are respectively provided on the single surfaces of the silicon substrates A, B, at least any one of $SiO_2$ films OA, OB has thickness of 1 μm or more. These $SiO_2$ films OA, OB are bonded and moreover the one silicon substrate B of such a bonded substrate is ground to thickness of about 1 μm. A semiconductor device having a trench structure wherein the trench formed on the silicon substrate B passes through the interface between the $SiO_2$ film OB and the $SiO_2$ film OA. The bottom of such a trench is located within the $SiO_2$ film OA and the bottom of the polycrystalline silicon conductive film within the trench is located within the $SiO_2$ film OA rather than the interface between the silicon substrate B and $SiO_2$ film OB.

10 Claims, 9 Drawing Sheets

SEMICONDUCTOR DEVICE USING SOI SUBSTRATE

BACKGROUND OF THE INVENTION

1. Field of the Invention

The present invention relates to a semiconductor device formed on an SOI (semiconductor on insulator) substrate and particularly to a semiconductor device having a trench provided on a direct bonded SOI substrate.

For high speed operation of a semiconductor device, particularly, of a MOS transistor, it is one of the effective methods to make smaller a parasitic capacitance thereof, for example, a capacitance between a diffused layer or metal wiring and a silicon substrate. As a method for this purpose, a substrate having the so-called SOI structure (hereinafter called simply SOI substrate) is used. That is, when a substrate on which a device is formed (this is called a device substrate) is formed through an insulator layer provided on a substrate for supporting the entire part (it is called a base substrate), a more perfect element isolation structure can be realized and a parasitic capacitance can be lowered. For the SOI substrate, a direct bonded SOI substrate, which is obtained by bonding directly a pair of silicon substrates, is attracting, in these years, the most distinctive attention because of its superiority in the fabrication cost and matching with the conventional fabrication process.

Moreover, the requirement for further miniaturization of the device results in the reduction in size of individual transistors to be formed in an LSI (Large Scale Integrated Circuit). However, the size of regions between transistors must also be reduced. For example, in the case of a structure of MOS-LSI wherein a thick oxide film is provided as the device isolation region at the surface between transistors, when the size of region between transistors becomes smaller, a punch-through between transistors becomes a problem. Such punch-through becomes difficult to be formed when the surface concentration of a silicon layer between transistors is made high but when the surface concentration of the silicon layer becomes higher, a junction capacitance becomes large, resulting in the interference with high speed operation of device. As a method of solving such problem, a device providing the trench isolation structure has been proposed.

As described above, a device providing the trench isolation structure on the direct bonded SOI substrate has been considered which is very effective for realizing high speed operation.

2. Description of the Related Art

Initially, a trench isolation structure formed on the conventional direct bonded SOI substrate will be explained.

FIG. 1 is a sectional view of a trench isolation structure where a base substrate 31 which is a silicon substrate and a device substrate 33 which is the other silicon substrate are bonded and a device having trench is formed therein. A silicon oxide insulating film 32a is formed to the one surface of the base substrate by the thermal oxidization and a silicon oxide insulating film 32b is formed also to the one surface of the device substrate 33. Then the insulating film 32a is brought into contact with the insulating film 32b. Thereafter, the insulating film 32a and insulating film 32b are bonded at the interface of the insulating film 32a and insulating film 32b, namely at the bonding surface 34 by conducting the annealing for two hours at the temperature of about 1200° C.

The trench 35 is formed on the device substrate 33 by silicon etching and the bottom of the trench 35 usually lies on the interface between the insulating film 32b and device substrate 33. In the trench 35, an insulating film 36 consisting of Si nitride, etc. and a conductive film 37 is provided in order to suppress charge storing. As explained above, the trench isolation structure is formed.

Combination of such a trench isolation structure and SOI substrate structure mutually separates device such as MOS transistor.

Such a trench isolation structure formed on the direct bonded SOI substrate is disclosed, for example, in the Japanese Laid-open Patent Application No. HEI-106466, "A Method of Fabricating Semiconductor Device" filed by Hiroshi Gotoh, on Oct. 19, 1987 (Application).

However, in such a structure, since a thermal expansion coefficient of polysilicon (poly-Si) forming a conductive film 37 buried in the trench 35 is larger than that of single crystal Si forming the device substrate 33, when temperature rises in the device fabrication process, a stress as indicated by the arrow mark Y1 in FIG. 2 is generated in the side of the device substrate 33. As a result, crystalline defect is easily generated in the device substrate 33 and thereby a leak current at the p-n junction increases.

On the other hand, in such structure, under the operating condition, a voltage difference is generated between the device substrate 33 on which devices are formed and the conductive film 37 usually to be used under the condition as being earthed to the ground potential. In the case of a device shown in FIG. 2 a following problem is generated. That is, the surfaces of the device substrate 33 and conductive film 37 are set in the equal potential and the field is equalized in such an area where the distance between the device substrate 33 and conductive film 37 is equal but field concentration indicated by XI is occurred at the corner where distance between the device substrate 33 and conductive film 37 changes and thereby a dielectric breakdown voltage is easily deteriorated and device reliability is also lowered.

In addition, when the trench 35 is formed crossing the bonding surface 34 in the device fabrication process explained above, a problem rises. Namely, the bonded insulating film 32a and insulating film 32b are easily separated at the bonding surface 34 during the cleaning of the trench surface with the fluoric acid solution for cleaning the trench.

Because of such background problems, it has long and ardently been desired to develop a highly reliable SOI device and a method of manufacturing the same which does not generate separation between bonded layers and which provides the trench isolation structure.

SUMMARY OF THE INVENTION

It is an object of the present invention to realize high speed operation and high density packing of a SOI device.

It is another object of the present invention to realize high reliability of a SOI device and a fabrication method thereof.

These objects are attained by fabricating a device where a device having the trench isolation structure is formed on the direct bonded SOI substrate in which the thickness of silicon oxide film formed on the surfaces of a pair of Si substrates used for bonding is 1.0 μm or more and such a trench is formed up to within the silicon oxide film in the side of the base substrate passing the bonding surface of the silicon oxide film from the device substrate.

According to the result of experiments by the inventors of the present invention, it has been proven that bonding strength becomes 1.5 t/cm$^2$ or more in cases where one of the thicknesses of the silicon oxide film formed on the base substrate and on the device substrate of the bonded SOI substrate is 1.0 μm or more. This value is a sufficiently bearable value in the LSI fabrication process.

When the trench is formed until it reaches the silicon oxide film in the side of base substrate passing the bonding surface of the silicon oxide film from the device substrate using such direct bonded SOI substrate, the conductive film can be formed until the position corresponding to the interface of at least the device substrate and its silicon oxide film.

Therefore, since a part of the stress based on the difference in thermal expansion coefficients of the poly-Si film formed in the trench and Si single crystal of the device substrate is relaxed into the silicon oxide layer including the bonding surface of the Si oxide film, the stress is released more effectively than that of the prior art. As a result, crystalline defect generated in the device substrate are reduced, a leak current of device is also reduced and the reliability of the device characteristics can be improved.

Moreover, since the bottom of the trench is provided within the Si oxide film in the side of the base substrate passing the bonding surface of the silicon oxide film, the bonding surface has been separated during the surface cleaning to be conducted after formation of trench but since the bonding strength in the present invention is 1.5 t/cm$^2$, the bonding surface is never separated.

Furthermore, the distance between the conductive film and the device substrate can be set, in this case, to a constant value and the electric field between the conductive film and the device substrate becomes uniform. Namely, the distance between the conductive film and the device substrate changes like the prior art and the corner where the electric field is concentrated is never generated. As a result the dielectric breakdown voltage in the trench is improved and the reliability of the device characteristics is also improved.

DESCRIPTION OF THE PREFERRED EMBODIMENTS

Figure 1:
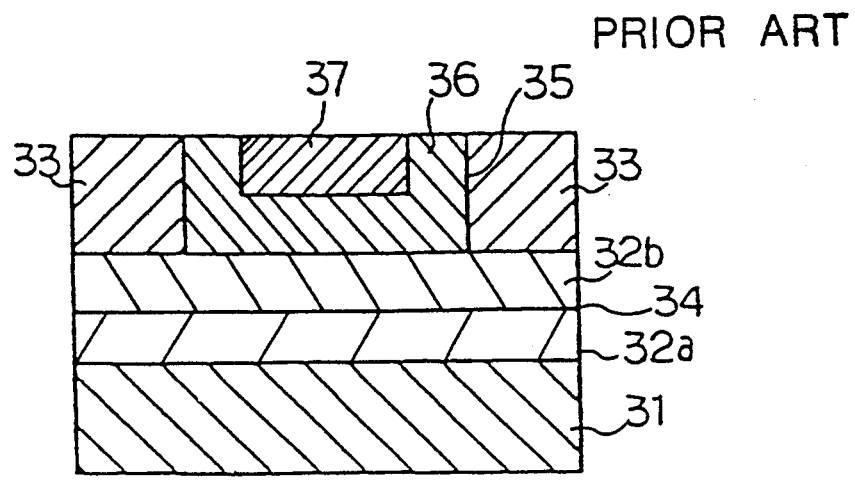
FIG. 1 is a schematic sectional view of the conventional SOI substrate having the trench isolation structure.

Three preferred embodiments of the present invention will be explained hereunder with reference to FIG. 3 to FIG. 10.

In these figures, the like reference numerals and characters designate the like members.

FIRST EMBODIMENT

Figure 3:
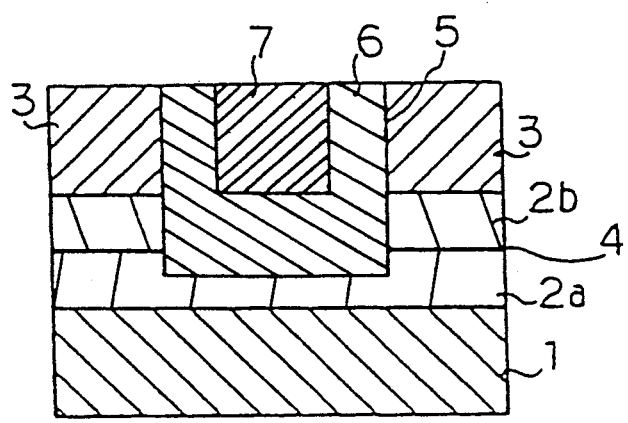
FIG. 3 is a schematic sectional view of a semiconductor device having the trench isolation structure of the present invention.
Figure 4:
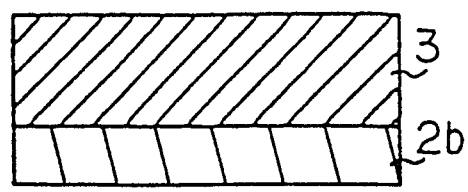
FIG. 4(a) shows a steps for forming a SiO$_2$ insulating film respectively to the single surface of the base substrate and the device substrate.
FIG. 4(b) shows a step for bonding the base substrate and device the substrate at the respective SiO$_2$ insulating film surfaces and then grinding the device substrate until it becomes the determined thickness.
FIG. 4(c) shows a step for forming the trench which reaches the silicon oxide film in the side of the base substrate passing the bonding surface of the Si oxide film from the device substrate by the selective etching.
Figure 4:
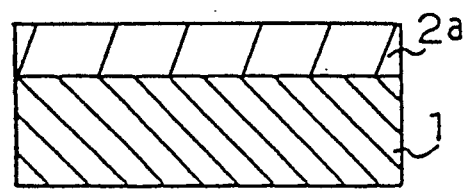
Figure 4:
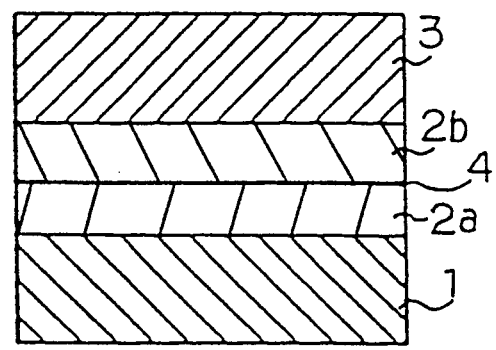
Figure 5:
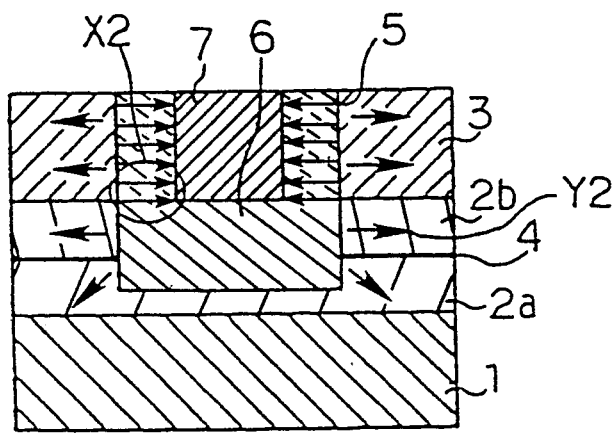
FIG. 5 is a diagram for explaining the effect of the present invention in the SOI substrate having the trench isolation structure.

FIGS. 3, 4, 5 are diagrams for explaining the first embodiment of the present invention. FIG. 3 is a schematic sectional view of a semiconductor device having the trench isolation structure. In this figure, the reference numeral 1 designates a base substrate consisting of Si; 2a, 2b, insulating films such as SiO$_2$; 3, a device substrate consisting of Si; 4, bonding surfaces at the interface between an insulating film 2a and an insulating film 2b; 5, a trench formed until reaching the insulating films 2a and 2b from the device substrate 3; 6, an insulating film formed, for example, by SiO$_2$ or Si$_3$N$_4$ to insulate from the device substrate 3; 7, a conductive film which may be formed by poly-Si to be used as the electrode.

Then, a method of fabricating the first embodiment of the present invention will be explained.

FIGS. 4(a)–4(c) are schematic sectional views indicating the steps of the fabrication processes. As shown in FIG. 4(a), a SiO$_2$ insulating film 2a in the thickness, for example, of 0.5 μm is formed by the thermal oxidization on single surface of the base substrate 1 in the thickness, for example, of 600 μm, while a SiO$_2$ insulating film 2b in the thickness, for example, of 1.0 μm is formed also by the thermal oxidization on a single surface of the device substrate 3 in the thickness of 600 μm, respectively.

Next, as shown in FIG. 4(b), the SiO₂ insulating film 2a formed on the base substrate 1 and the SiO₂ insulating film 2b formed on the device substrate 3 are placed in contact with each other and then annealed for two hours at about 1200° C. The SiO₂ insulating films 2a, 2b are bonded at the bonding surface 4 by such annealing process. Thereafter, the device substrate 3 is ground until the thickness becomes about 1 μm.

Next, as shown in FIG. 4(c), the trench 5 is formed until the SiO₂ insulating films 2a passing the bonding surface 4 of SiO₂ film from the device substrate 3 through selective etching of the device substrate 3 and SiO₂ insulating films 2a, 2b, for example, by the plasma RIE (Reactive Ion Etching). Here, the trench 5 has the width of 1 μm and the depth of 1.7 μm.

An example of forming the trench until the oxide film of SOI substrate is disclosed in the reference, "A FULLY FUNCTIONAL 1K ECL RAM ON A BONDED SOI WAFER" IEDM 88 870-871 By K. Ueno, Y. Arimoto, N. Odani, M. Ozeki and K. Imaoka. In this reference, a part of oxide film is accidentally etched during the etching of silicon on the device substrate. Therefore, it is apparently different from the present invention where the oxide film is intentionally etched until reaching the bonding surface.

The cleaning is carried out for removing damage generated at the surface within the trench 5 and etching residue such as silicon dioxide film (SiO₂) generated during the plasma RIE process described above. Thereafter, the SiO₂ insulating film 6 and CVD poly-Si conductive film 7 are formed by the CVD (Chemical Vapor Deposition) method within the trench 5 complete the trench isolation structure as shown in FIG. 3.

Figure 2:
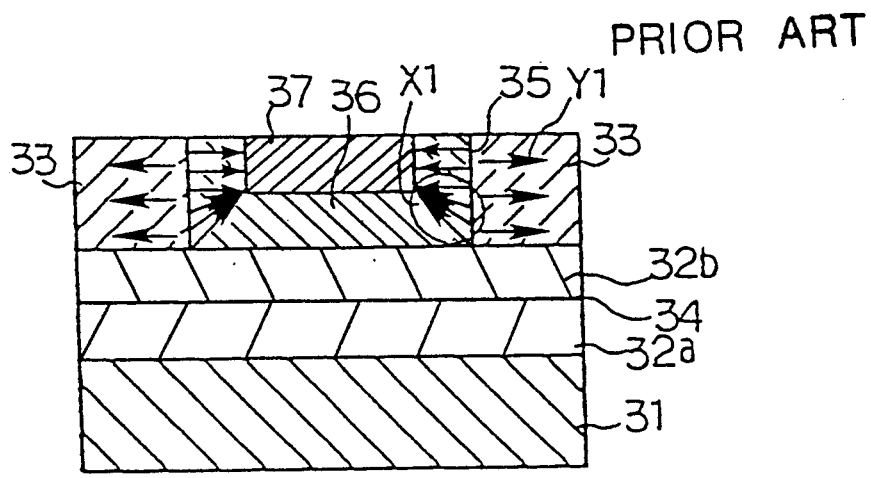
FIG. 2 is a diagram for explaining the problems of the conventional SOI substrate having the trench isolation structure.

Different from the case in FIG. 2, a part of the stress based on the difference in thermal expansion coefficients of the conductive film 7 and the device substrate 3 is dispersed in the sides of SiO₂ insulating films 2a, 2b as indicated by the arrow mark Y2 in FIG. 5. As a result of it, the stress is relaxed. In case the conductive film 7 is formed by being buried toward the SiO₂ insulating films 2a from the position corresponding to the interface between the SiO₂ insulating films 2a and device substrate 3 (not illustrated in FIG. 5), the stress is further relaxed.

Moreover, in case the trench is formed by being buried until reaching the SiO₂ insulating film 2a, as shown in FIG. 5, the electric field between the conductive film 7 and device substrate 5 becomes uniform as indicated by the arrow mark X2 and is never concentrated to the corners.

After formation of the trench 5 as explained above, during the cleaning process for the surface of the trench 5 to be carried out by the fluoric acid solution, the base substrate 1 and device substrate 3 are sometimes isolated.

Figure 6:
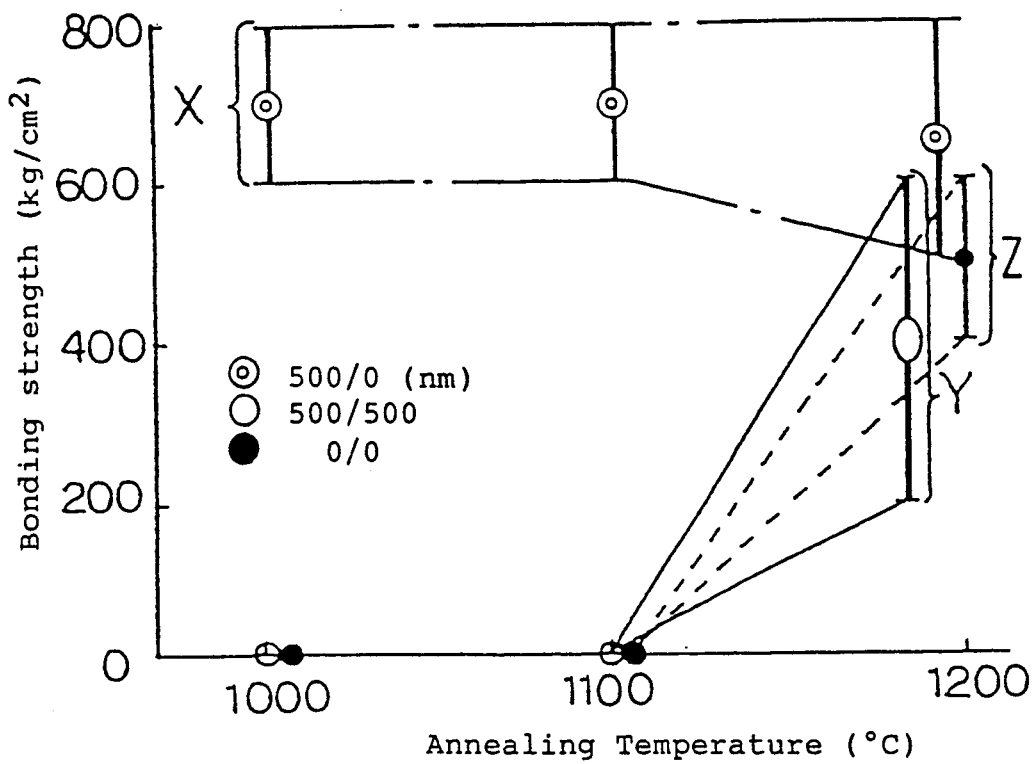
FIG. 6 is a graph showing the relationship between bonding strength and annealing temperature where the base substrate is bonded with the device substrate through the SiO$_2$ insulating film.

FIG. 6 is a graph indicating, for three kinds of samples, changes in the bonding strength by the annealing temperature in the process for bonding the base substrate 1 and device substrate 3 through the SiO₂ insulating films 2a and 2b. The annealing time is set to two hours for respective samples.

In this figure, the samples indicated by white circles comprise the SiO₂ insulating films 2a and 2b in the thickness of 500 nm, while the samples indicated by black circles do not comprise the SiO₂ insulating films. Such samples cannot bond the layers by the annealing temperature of 1100° C. or lower. In the annealing of 1100° C. or higher, the samples indicated by the white circles have the bonding strength within the range Y indicated by a solid line, while that indicated by the black circles have the bonding strength within the range indicated by a dotted line. When the annealing temperature is about 1200° C., bonding strength is 200-600 Kg/cm². In the same figure, the samples indicated by double circles comprise the SiO₂ insulating films 2a and 2b in which the one is formed in the thickness of 500 nm while the other has the thickness of zero, namely the sample comprises only one SiO₂ insulating film. In this case, when the annealing temperature is 1000° C. or higher, bonding strength is within the range indicated by a chain line and is set to a value about 600-800 Kg/cm². As seen from FIG. 6, bonding strength between the SiO₂ insulating films is smaller than that between the SiO₂ insulating film and bare Si material.

Figure 7:
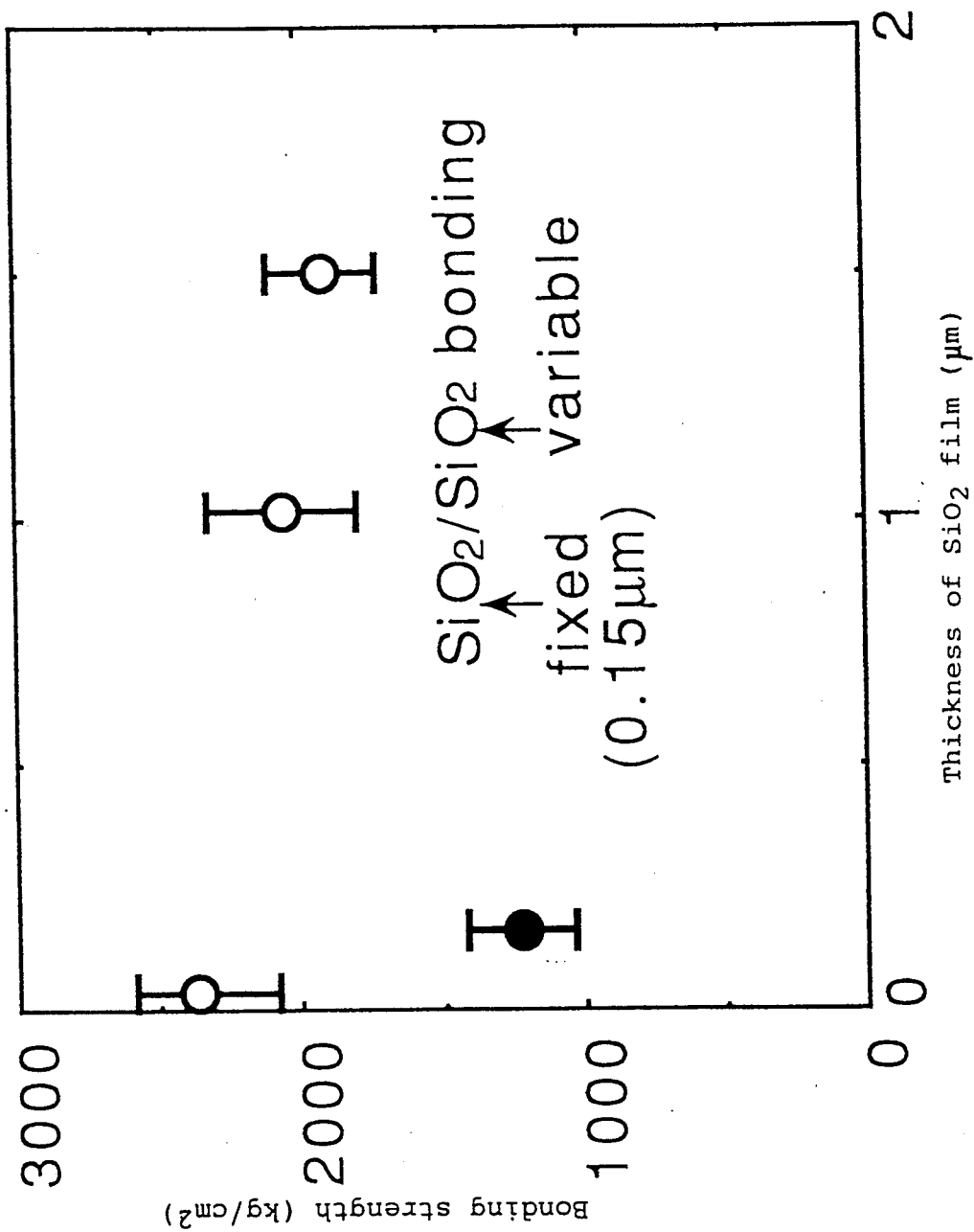
FIG. 7 is a graph showing the relationship between bonding strength and the thickness of the SiO$_2$ insulating film of the other substrate where the thickness of the SiO$_2$ insulating film of the one substrate of the bonded substrates is fixed to 0.15 μm.

FIG. 7 is a graph indicating how bonding strength changes when thickness of SiO₂ insulating film of the one substrate is fixed to 0.15 μm and thickness of SiO₂ insulating film of the other substrate is changed. The annealing temperature for the bonding process is set to 1100° C. and such annealing is carried out for 30 minutes under the nitrogen gas ambience. As can be understood from this figure, a bonding strength of several of samples indicated by the white circles where two sheets of substrates were bonded providing the SiO₂ insulating films in thicknesses of 0.15 μm and 1 μm or more is about 2200 Kg/cm². Moreover, a bonding strength of a sample indicated by a white circle having the one substrate with the SiO₂ insulating film in thickness under 1 μm and the other substrate having the SiO₂ insulating film in thickness of zero, namely the bare Si substrate, is about 2200 Kg/cm². On the other hand, a bonding strength is about 1200 Kg/cm² where a sum of the thickness of the SiO₂ insulating films of both substrates like the samples indicated by the black circles is smaller than 1 μm.

Accordingly, it can be understood, where both substrates have the SiO₂ insulating films, a sufficient bonding strength can be obtained when the of the SiO₂ insulating film of at least one substrate is 1 μm or more.

Figure 8:
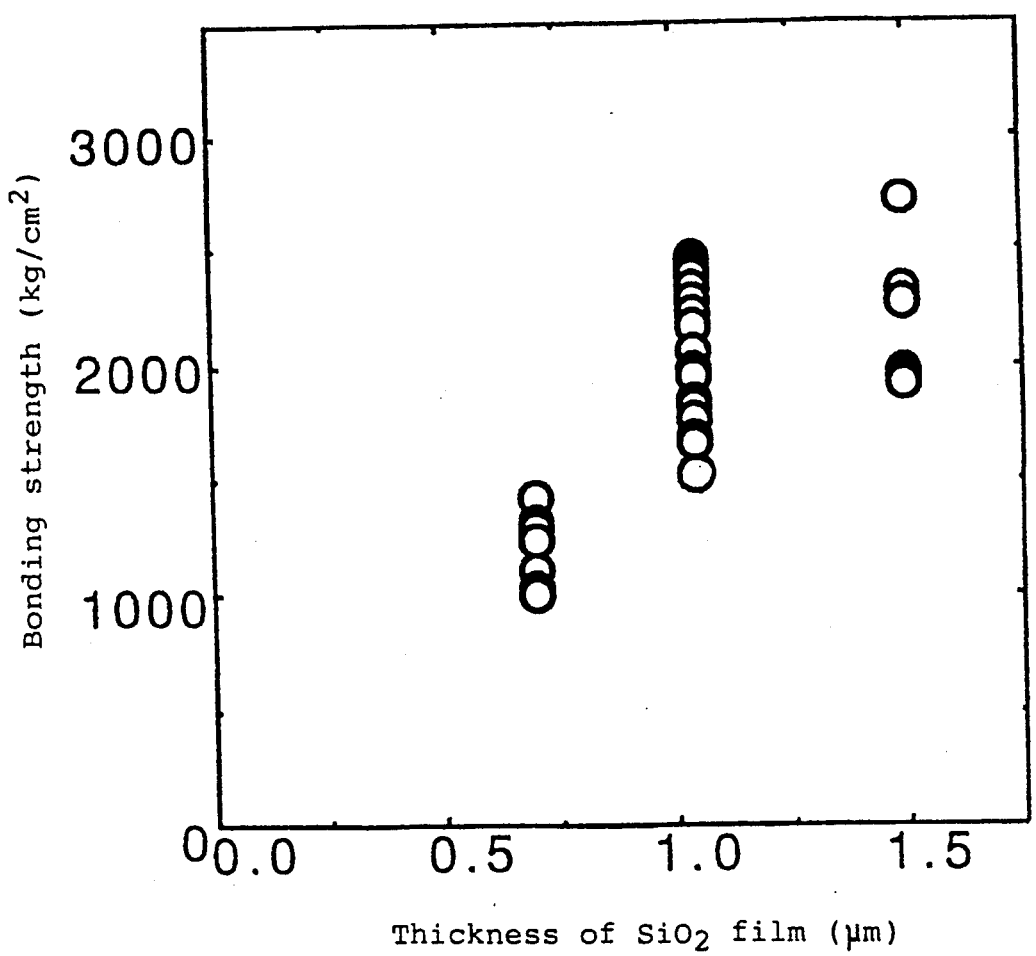
FIG. 8 is a graph showing to relationship between bonding strength and thickness of SiO$_2$ insulating film in such a case that the thickness of the respective SiO$_2$ insulating films of the base substrate and the device substrate is equal.
Figure 9:
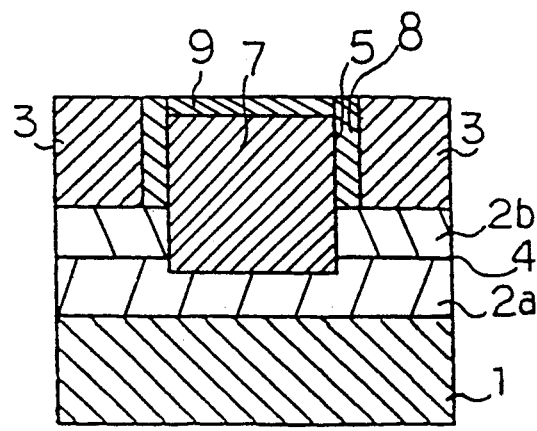
FIG. 9(a) is a modification diagram for the trench isolation structure of FIG. 3.
FIG. 9(b) is a modification diagram for the trench isolation structure of FIG. 9(a)
FIG. 9(c) is a modification diagram for the trench isolation structure of FIG. 9(b)
Figure 9:
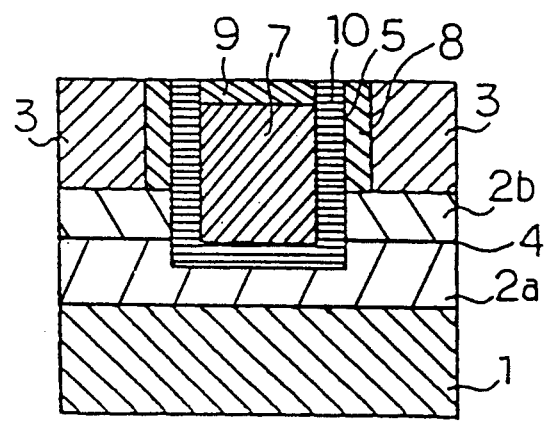
Figure 9:
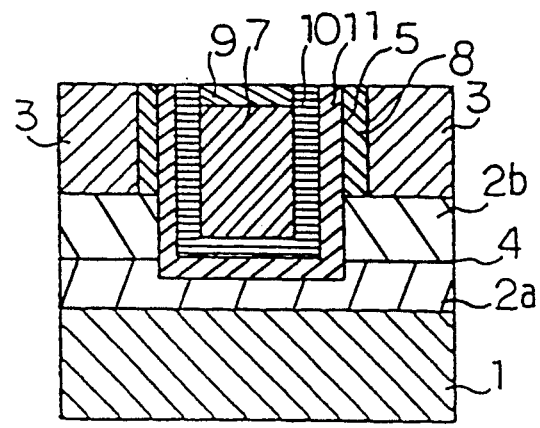
Figure 10:
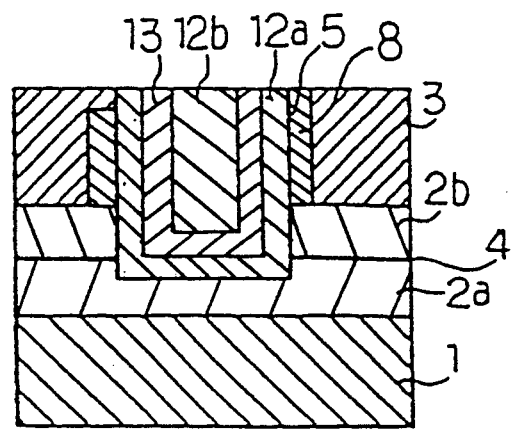
FIG. 10(a) is a diagram indicating the trench capacitor structure to which the present invention is applied.
FIG. 10(b) is a modification diagram for the trench isolation structure of FIG. 10(a)
FIG. 10(c) is a modification diagram for the trench isolation structure of FIG. 10(b).
Figure 10:
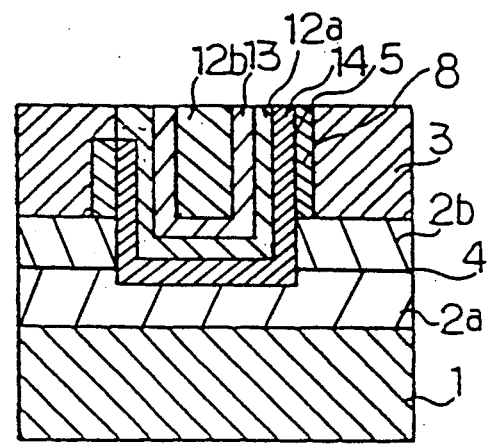
Figure 10:
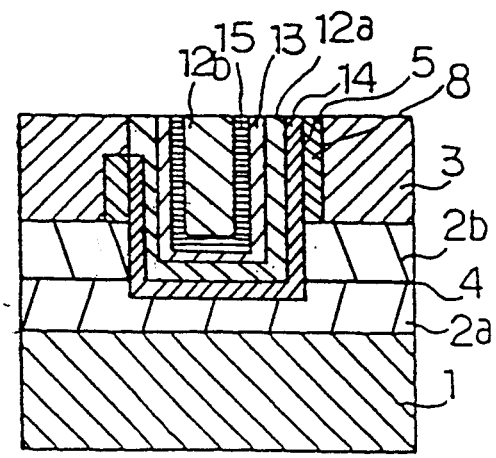

FIG. 8 is a graph indicating how bonding strength changes depending on the thickness of the SiO₂ insulating film when thickness of both SiO₂ insulating films 2a and 2b are equal. When the SiO₂ insulating film becomes thicker, bonding strength increases and when the thickness of the SiO₂ insulating films 2a and 2b is respectively 1.0 μm or more, the bonding strength becomes 1.5 ton/cm² or higher which is enough strength for LSI process. From FIG. 8, it can be understood that a sufficiently large bonding strength can be obtained not only where the SiO₂ insulating film of the one substrate is fixed to 0.15 μm as the case in FIG. 7, but also in cases where the thickness of the SiO₂ insulating films 2a and 2b of both substrates is 1.0 μm or more.

SECOND EMBODIMENT

FIGS. 9(a)-9(c) are diagrams indicating modifications of FIG. 3 in the first embodiment of the present invention.

FIG. 9(a) indicates the trench isolation structure comprising a thermally oxidized SiO₂ insulating film 8 formed at the side wall of trench 5, a CVD poly-Si conductive film 7 filling the trench 5 and a thermally oxidized SiO₂ insulating film 9 formed on the trench 5.

FIG. 9(b) indicates the trench isolation structure comprising a thermally oxidized $SiO_2$ insulating film 8 formed at the side wall of trench 5, a CVD poly-Si conductive film 7 deposited within the trench 5, a thermally oxidized $SiO_2$ insulating film 9 formed on the trench 5 and a CVD $Si_3N_4$ insulating film 10 formed between the thermally oxidized $SiO_2$ insulating film 8 and the CVD poly-Si conductive film 7.

This structure is somewhat more complicated than the trench isolation structure shown in FIG. 9(a) but is superior in the insulation property.

FIG. 9(c) indicates the trench isolation structure comprising a thermally oxidized $SiO_2$ insulating film 8 formed at the side wall of the trench 5, a CVD poly-Si conductive film 7 deposited within the trench 5, a thermally oxidized $SiO_2$ insulating film 9 formed on the trench 5, a CVD $Si_3N_4$ insulating film 10 formed between the thermally oxidized $SiO_2$ insulating film 8 and the CVD poly-Si conductive film 7 and a CVD $SiO_2$ insulating film 11 formed between the thermally oxidized $SiO_2$ insulating film 8 and the CVD $Si_3N_4$ insulating film 10.

This structure is somewhat complicated than the trench isolation structure shown in FIG. 9(b) but is superior in the insulation property.

The trench isolation structure in which the sequence of forming the CVD $Si_3N_4$ insulating film 10 and the CVD $SiO_2$ insulating film 11 in FIG. 9(c) is reversed can also be formed easily. Moreover, in this second embodiment, the direct bonded SOI substrate comprising the $SiO_2$ insulating films 2a and 2b is used but when any one of such films has thickness of 1 $\mu$m or more, the present invention can be applied to the substrate in which the other film has a thickness of zero, namely the other substrate does not provide the $SiO_2$ insulating film. In addition, this embodiment can also be applied to SIMOX SOI substrate.

SIMOX is explained in detail, for example, in the reference, Sorin Cristoloveanu: "Electrical Evaluation of SIMOX Material and Integrated Devices", Material Research Society Symposium Proceeding, Vol. 107, p.335–347, 1988.

THIRD EMBODIMENT

An example of applying the present invention to the trench capacitor structure is shown in FIGS. 10(a)-10(c).

FIG. 10(a) is a trench capacitor structure comprising a thermally oxidized $SiO_2$ insulating film 8, capacitor electrodes 12a, 12b and a CVD $SiO_2$ insulating film 13 which is a dielectric film of a capacitor.

FIG. 10(b) is a trench capacitor structure comprising a thermally oxidized $SiO_2$ insulating film 8, a CVD $SiO_2$ insulating film 13 which is a dielectric film of a capacitor, and a CVD $SiO_2$ insulating film 14 formed between a thermally oxidized $SiO_2$ insulating film 8 and a capacitor electrode 12. This structure is somewhat complicated than the trench capacitor structure FIG. 10(a) but is superior in the insulation property.

FIG. 10(c) is a trench capacitor structure comprising a thermally oxidized $SiO_2$ insulating film 8, capacitor electrodes 12a, 12, a CVD $Si_3N_4$ insulating film 15 and a CVD $SiO_2$ insulating film 14 formed between a thermally oxidized $SiO_2$ insulating film 8 and a capacitor electrode 12.

This structure is somewhat more complicated than the trench capacitor structure shown in FIG. 10(b) but is superior in the insulation property and capacitance thereof.

Moreover, a direct bonded SOI substrate comprising the $SiO_2$ insulating films 2a and 2b is used but when any one of such films has thickness of 1 $\mu$m or more, the present invention can be applied to the substrate in which the other film has a thickness of zero, namely the other substrate does not provide a $SiO_2$ insulating film. In addition, the present invention can also be applied to the SIMOX SOI substrate.

What is claimed is:

1. A semiconductor device having an active element formed in a semiconductor layer on an insulating layer, comprising:
    a first semiconductor layer;
    a first insulating layer formed on said first semiconductor layer;
    a second insulating layer directly bonded on said first insulating layer;
    a second semiconductor layer on said second insulating layer;
    a trench in said second semiconductor layer, said trench having a bottom reaching to said first insulating layer through said second semiconductor layer and said second insulating layer; and
    a mass filling said trench.

2. A semiconductor device according to claim 1, wherein said mass comprises a third insulating layer formed on a surface of said trench and a conductive material formed on said third insulating layer.

3. A semiconductor device according to claim 2, wherein said bottom of said conductive material is located on the interface between said second semiconductor layer and said second insulating layer or located within first insulating layer of said interface.

4. A semiconductor device according to claim 1, wherein said first insulating layer is a first silicon oxide layer formed on a first silicon layer as said first semiconductor layer, while said second insulating layer is a second silicon oxide layer formed on a second silicon layer as said second semiconductor layer.

5. A semiconductor device according to claim 1, wherein said first insulating layer has the thickness of 1 $\mu$m or more.

6. A semiconductor device according to claim 1, wherein said second insulating layer has the thickness of 1 $\mu$m or more.

7. A semiconductor device according to claim 2, wherein said conductive material is composed of polycrystalline silicon and said third insulating layer is composed of silicon dioxide ($SiO_2$) or silicon nitride film ($Si_3N_4$).

8. A semiconductor device according to claim 2, wherein said trench further comprises a silicon dioxide layer formed by thermal oxidation before forming said third insulating layer on said second semiconductor layer, said silicon dioxide layer being formed along a part of side wall of said trench, further said second semiconductor layer being a second silicon layer.

9. A semiconductor device according to claim 2, wherein said third insulating layer is selected from the group consisting of a silicon oxide layer and a double layer of silicon oxide layer and silicon nitride layer.

10. A semiconductor device according to claim 2 or 8, said trench further comprising;
    a first conductive layer formed on said third insulating layer as an electrode of a capacitor;
    a fourth insulating layer formed on said first conductive layer as an insulating layer of said capacitor; and
    a second conductive layer formed on said fourth insulating layer as another electrode of said capacitor.

* * * * *